United States Patent
Girardie et al.

(10) Patent No.: US 6,727,138 B2
(45) Date of Patent: *Apr. 27, 2004

(54) PROCESS FOR FABRICATING AN ELECTRONIC COMPONENT INCORPORATING AN INDUCTIVE MICROCOMPONENT

(75) Inventors: Lionel Girardie, Eybens (FR); Jean-Baptiste David, Saint Martin D'Heres (FR)

(73) Assignee: Memscap, Crolles (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/303,401

(22) Filed: Nov. 25, 2002

(65) Prior Publication Data

US 2003/0098766 A1 May 29, 2003

(30) Foreign Application Priority Data

Nov. 29, 2001 (FR) .............................. 01.15456

(51) Int. Cl.⁷ ......................................... H01L 21/8244
(52) U.S. Cl. ..................... 438/238; 438/381; 438/687
(58) Field of Search ................................. 438/687, 678, 438/381, 238, 3

(56) References Cited

U.S. PATENT DOCUMENTS

| | | | |
|---|---|---|---|
| 5,874,883 A | 2/1999 | Uemura et al. | 336/200 |
| 6,030,877 A | 2/2000 | Lee et al. | 438/381 |
| 6,459,135 B1 | 10/2002 | Basteres et al. | 257/528 |
| 6,551,919 B2 * | 4/2003 | Venkatesan et al. | 438/622 |
| 6,573,822 B2 * | 6/2003 | Ma et al. | 336/223 |
| 6,586,322 B1 * | 7/2003 | Chiu et al. | 438/612 |

* cited by examiner

*Primary Examiner*—Thanh Nguyen
(74) *Attorney, Agent, or Firm*—Heslin Rothenberg Farley & Mesiti P.C.

(57) ABSTRACT

The invention relates to a process for fabricating electronic components incorporating an inductive microcomponent placed on top of a substrate. Such a component comprises: a layer (10) of material having a low relative permittivity, lying on the top face of the substrate (1); a number of metal turns (30–31) defined on top of the layer (10) of material having a low relative permittivity; and a copper diffusion barrier layer (15) interposed between the metal turns (30–31) and the layer of material having a low relative permittivity.

17 Claims, 5 Drawing Sheets

PROCESS FOR FABRICATING AN ELECTRONIC COMPONENT INCORPORATING AN INDUCTIVE MICROCOMPONENT

CROSS REFERENCE TO RELATED APPLICATIONS

This application claims the priority of French patent application 01.15456 filed Nov. 29, 2001. The entire disclosure thereof is incorporated herein by reference. This Application is also related to two other U.S. patent application Ser. Nos. 10/303,466 and 10/303,627, filed on Nov. 25, 2002 of like title identified by Attorney Docket Nos. 1759.108 and 1759.109, each of which is being filed concurrently herewith. Each of these Applications is also incorporated by reference herein in its entirety.

TECHNICAL FIELD

The invention relates to the field of microelectronics. More specifically, it relates to a process for producing inductive microcomponents on a substrate, which itself can incorporate an integrated circuit.

The components may especially be used in radiofrequency applications, for example in the field of telecommunications.

The subject of the invention is more specifically a process for obtaining circuits having a markedly higher performance than existing components, especially as regards the value of the quality factor. The process forming the subject of the invention also limits the number of steps needed to produce such components and ensures good reproducibility of the characteristics of the components that it allows to be fabricated.

PRIOR ART

In document FR 2 791 470, the applicant has described a fabrication process for producing microinductors or microtransformers on top of a substrate, and especially on top of an integrated circuit. To summarize, this process consists in depositing a layer of material having a low relative permittivity and then etching this material at an aperture made in the hard mask, vertically above a pad for connection with the rest of the integrated circuit, so as to define an interconnection hole, or via.

After having deposited a resist on top of the hard mask, said resist is etched to form the channels defining the geometry of the turns of the inductive component. Thereafter, copper is deposited electrolytically on top of the connection pad and in the channels defined in the top resist.

Such a process has a number of drawbacks, among which may be noted essentially the fact that the electro-deposition step ensures both the formation of the turns of the inductive component and the filling of the via, allowing contact with the metal pad connected to the integrated circuit. Since these regions have different depths, it follows that the electrodeposition is carried out differently at the turns and at the via. Thus, certain irregularities are observed in the formation of the turns, these being prejudicial to good uniformity of the electrical performance of the inductive component.

Furthermore, during the step of etching the top resist, it is necessary to etch longer at the via, compared with the regions in which the channels intended to accommodate the turns are formed. This difference in etch depth causes the release of chemical compounds at the bottom of the via, thereby interfering with the subsequent copper electrodeposition operation.

One of the objectives of the invention is to alleviate these various drawbacks, and especially to make it possible to produce components which have dimensional characteristics that are as precise as possible, so as to give optimum electrical performance.

SUMMARY OF THE INVENTION

The invention therefore relates to a process for fabricating an electronic component. Such a component incorporates an inductive microcomponent, such as an inductor or a transformer, which is placed on top of a substrate and connected to this substrate by at least one metal pad.

In accordance with the invention, this process is one which comprises the following steps:
a) depositing a layer of material having a low relative permittivity on the substrate;
b) depositing a layer forming a hard mask;
c) forming an aperture in the hard mask vertically above the metal pads;
d) etching the layer of material having a low relative permittivity down to the metal pad, in order to form an interconnection hole or via;
e) depositing a layer forming a copper diffusion barrier;
f) depositing a copper primer layer;
g) depositing a protective mask and removing it from the bottom of the via;
h) depositing copper, electrolytically, in the via;
i) removing the rest of the protective mask;
j) depositing a top resist layer with a thickness similar to the thickness of the turns of the inductive microcomponent;
k) etching the top resin layer in order to form channels defining the geometry of the turns of the inductive microcomponent;
l) depositing copper electrolytically in the channels thus etched;
m) removing the rest of the top resist layer;
n) etching the copper primer layer between the copper turns; and
o) etching the copper-diffusion barrier layer between the turns of the inductive microcomponent.

Thus, the process according to the invention links together a number of steps which provide certain improvements over the processes of the prior art. It will be noted in particular that the copper electrodeposition takes place in two separate steps, namely, to begin with, a first step for filling the via, thereby allowing firstly copper to be grown up to level with the lower plane of the inductive microcomponent. In a second step, a copper electro-deposition process is carried out, thereby forming simultaneously the turns of the inductive component and the region of connection between the turns and the via already filled in during the prior deposition step.

Separating these two copper deposition steps in this way ensures homogeneity of this deposition, this being favorable to uniformity of the shape of the turns, and therefore to the quality of the electrical performance and the reproducibility of the process.

It will also be noted that this process can be used on various types of substrate. Thus, in a first family of applications, the process can be used on a semiconductor substrate and especially a substrate that has been functionalized beforehand in order to form an integrated circuit.

In other types of application, it may be a specific substrate, such as an amorphous substrate of the glass or quartz type, or more generally a substrate possessing electrical, optical or magnetic properties suitable for certain applications.

In practice, the material having a low relative permittivity which is deposited on the substrate, may be benzocyclobutene (BCB), or else, a similar material whose relative permittivity is typically less than 3.

In practice, the thickness of this layer of material having a low relative permittivity may be between 10 and 40 microns, preferably being about 20 microns.

The thickness of this layer defines substantially the distance between the inductive component and the substrate. This distance, combined with the relative permittivity of the material of this layer, defines the parasitic capacitance existing between the inductive component and the substrate, and it is highly desirable to minimize this capacitance.

In practice, the material used to form the hard mask on top of the BCB may be chosen from the group comprising: SiC, SiN, $Si_3N_4$, SiON, $SiO_2$, SiOC, $Y_2O_3$, Cr, taken individually or in combination.

The properties of these materials include good compatibility with BCB, especially good adhesion as hard mask on the BCB surface. These materials have mechanical properties suitable for them to be used in masking. This avoids the appearance of excessively high stresses at the junction between the hard mask and the subjacent BCB layer. Moreover, by a judicious choice of these materials having the function of a hard mask for the purposes of etching the vias, high selectivity of the BCB etching compared with these materials is acquired, so as to avoid any underetching of the BCB, and thus to obtain the desired profiles without delamination.

This is because the stresses between the BCB and the hard mask could be transferred right to the substrate and cause possible fractures in the latter. Such phenomena owing to excessively high stresses are especially observed in the processes of the prior art, which use thick layers of certain metals to produce the hard mask on top of a BCB layer, with as consequence the risk of poor adhesion.

In practice, and especially when the hard mask is conducting, and typically based on chromium, this hard mask may be removed before the copper-diffusion barrier layer is deposited, so as to remove any inter-turn conducting region.

According to another feature of the invention, a layer forming a copper diffusion barrier is deposited on top of the layer of material having a low relative permittivity, when the hard mask has been removed. This barrier layer allows the subjacent layer to be isolated from the copper that will be deposited subsequently, especially in the form of the primer layer. This characteristic barrier layer prevents the migration of copper through the layer of low relative permittivity, something which would have the effect of increasing this permittivity, and therefore of increasing the parasitic capacitance between the inductive microcomponent and the substrate, and of creating sources of defects. This barrier layer also prevents the copper from migrating into the substrate, which would have prejudicial consequences on the quality or the operation of the integrated circuit.

In practice, the barrier layer may be made of tungsten or from a material chosen from the group comprising: TiW, Ti, TiN, Ta, TaN, WN, Re, Cr, Os, Mo, Ru. These materials may be used individually or in combination.

Advantageously, in practice, the thickness of the copper-diffusion barrier layer may be between 100 and 400 Å.

According to another feature of the invention, the process may include a step of enriching the copper primer layer. This primer layer acts as the electrode for the subsequent copper electrodeposition operations.

It may prove useful under certain conditions to improve the regularity and the morphology, the oxidation state of the copper, the roughness and the lack of nucleation sites in the primer layer. This primer layer is deposited by a physico-chemical technique, more particularly by the technique called sputtering and its ionized metal plasma variant. In this case, a step to enrich this primer layer by exposing the primer layer to an electrolyte solution is carried out. This solution, containing copper salts, allows copper to be deposited in any spaces existing between the copper islands deposited beforehand during the production of the primer layer, this enriching step therefore smoothing out this primer layer so as to improve the subsequent electro-deposition.

Advantageously, in practice, an annealing step may be carried out so as to increase the size of the copper crystals deposited during the electrodeposition steps. This annealing step, typically carried out by exposing the component to a temperature between 150 and 400° C. for a time of a few minutes, ensures crystalline uniformity of the copper deposited, and therefore the homogeneity and the conducting nature of the copper which will form the turns of the inductive component. Thus, the electrical properties of the component are improved by reducing the number of singularities that could be the source of resistive spots or points of mechanical weakness.

Advantageously, in practice, a step of decontaminating the copper liable to migrate into the substrate, especially at the lateral and rear faces of the substrate, as well as around its circumference, may be carried out. This is because when the component is exposed to a solution containing copper salts soluble in a judiciously chosen solvent, it is necessary to remove any excess copper deposited. In fact, when this metal is deposited using electrolytic techniques and with a specific current distribution between the cathode and the anode, excess copper is generally observed to be deposited around the circumference of the substrate. Moreover, the convection and mass-transfer process, which is at the basis of the technique of depositing the element copper by electrolysis, generates, on the lateral or rear faces of the substrate, a possible flux and diffusion over certain regions of the substrate. To avoid any possible migration into the substrate, it is recommended to use this step.

In practice, this decontamination step may be performed after both of the two electrodeposition steps.

In practice, the protective mask deposited during the step following deposition of copper primer layers may be formed from a negative photoresist. This allows it to be easily removed at the bottom of the via in which the first copper electrodeposition will subsequently take place. Modifying the properties of the photoresist allows it to cure in the regions exposed during exposure of the lithography mask. A surface deposition of copper is thus avoided, by virtue of the screen thus formed on the surface of the enriched primer layer by the cured resist.

Advantageously, in practice, before the step of depositing the top resist, it is possible to carry out a treatment either with hexamethyldisilazane (HMDS) or divinyltetramethyl-disilazane (DVTMDS), as desired. This treatment makes it possible to obtain good copper-resist adhesion properties, thereby improving the growth of the copper on the vertical sidewalls of the channels intended to accommodate the turns.

According to other features of the invention, a number of cleaning steps may be carried out using a chemical not corrosive to copper. These cleaning steps may be carried out after the copper electrodeposition, and after the step of depositing the copper primer layer, or else after the copper-diffusion barrier layer has been deposited.

The invention also relates to an electronic microcomponent that can be produced using the above-mentioned process. Such a component incorporates an inductive microcomponent placed on a substrate and connected to the latter by at least one metal pad.

This component comprises:

a layer of material having a low relative permittivity, lying on the top face of the substrate;

a number of metal turns defined on top of the layer of material having a low relative permittivity; and a copper-diffusion barrier layer interposed between the metal turns and the layer of material having a low relative permittivity.

BRIEF DESCRIPTION OF THE FIGURES

The manner of implementing the invention and the advantages which stem therefrom will become clearly apparent from the description of the illustrative example which follows, supported by the appended FIGS. 1 to 19, which are sectional representations of a connection pad, of the substrate and of the various layers, that are deposited as the steps of the process proceed. The thicknesses of the various layers illustrated in the figures are given in order to allow the invention to be understood, but are not always in keeping with the actual thicknesses and dimensions.

MANNER OF IMPLEMENTING THE INVENTION

As already mentioned, the invention relates to a process for producing inductive microcomponents on a substrate. In the example illustrated in the figures, the substrate (1) used is a substrate that has been treated beforehand so as to form an integrated circuit. Nevertheless, other different substrates may be used, such as especially substrates based on quartz or glass.

Figure 1:
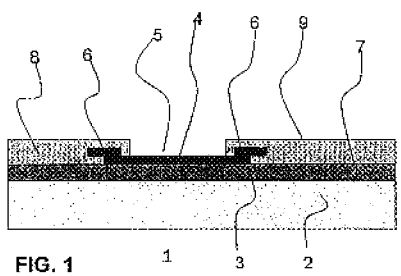

Thus, such a substrate (1), as illustrated in FIG. 1, includes the top level (2) of the actual integrated circuit, surmounted by a layer (3) of doped substrate.

In the figure shown the substrate (1) also includes a metal pad (4), made of a metal which may be aluminum or an aluminum alloy or copper, the top face (5) of which is accessible. The edges (6) of this metal pad and the top face (7) of the doped layer are covered with a passivation layer (8).

The process according to the invention may link together the various steps described below, it being understood that some of them may be carried out differently, while still obtaining similar results. Some of the steps may also be regarded as useful, but not absolutely essential, and therefore in this regard may be omitted without departing from the scope of the invention.

Step 1

The first step consists in cleaning the top face (5) of the metal connection pad (4) and of the passivation layer (8) deposited on the substrate. This cleaning operation is carried out by a wet chemical technique.

Step 2

Figure 2:
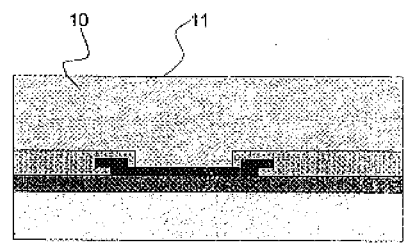

As illustrated in FIG. 2, the process continues with the deposition of a layer (10) of benzocyclobutene (BCB), or of any equivalent material possessing a relative permittivity of less than 3. This deposition is carried out by a process called spin-on deposition. The thickness deposited is about 20 microns.

Step 3

The process continues with a step of cleaning the top face (11) of the BCB layer (10). This cleaning, carried out with a suitable solution ensures that the top face (11) of the BCB layer (10) is cleaned and prepared.

Step 4

Figure 3:
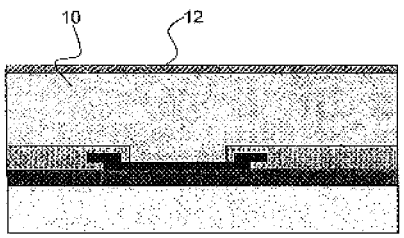

As illustrated in FIG. 3, the process continues with the deposition of a layer (12) forming a hard mask on top of the BCB layer (10). This layer (12) has a thickness of around 200 Å. The material employed is preferably silicon carbide (SiC), but it could also be SiOC, SiN, $Si_3N_4$, SiON, $SiO_4$, $SiO_2$, Cr or $Y_2O_3$ or any other material, as long as the etching selectivity with respect to the material of the bottom layer is at least 10:1. This hard mask layer (12) may be deposited by a plasma-enhanced chemical vapor deposition (PECVD) process.

Step 5

Figure 4:
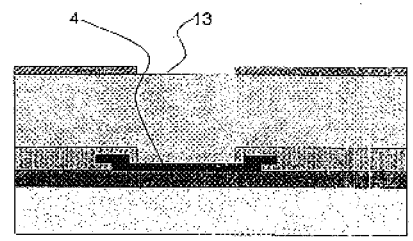

Thereafter, an aperture (13) is made in the hard mask (12) as illustrated in FIG. 4, by a lithography process and suitable chemical etching using a wet process, such as a solution based on hypophosphoric acid at a temperature of 180° C. if the hard mask is composed of silicon nitride, or dry plasma etching using a reactive gas containing fluorine, such as $CF_4/H_2$, for example.

Step 6

Figure 5:
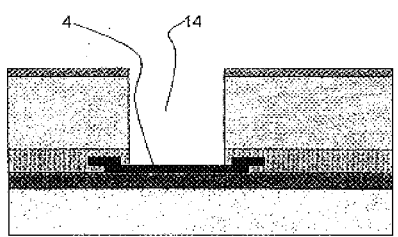

The process then continues as illustrated in FIG. 5 with the etching of the BCB layer (10), vertically above the metal connection pad (4), so as to form the via (14). The BCB layer may be etched especially by using a gas mixture such as the $Ar/CF_4/O_2$ mixture, or else by a radiofrequency plasma using other reactants.

Step 7

Figure 6:
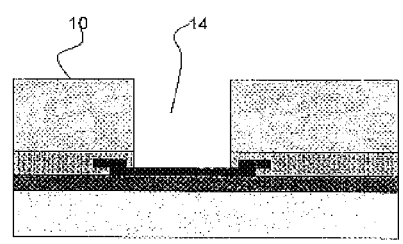

The process continues, as illustrated in FIG. 6, with the removal of the hard mask which remained on the remaining parts of the BCB layer (10). This hard mask is removed by etching, by using a solution composed of $Ce(SO_4)_2/2(NH_4)_2SO_4/HClO_4$/deionized water if the hard mask is made of chromium for example. The hard mask may also not be removed, and therefore kept on the BCB layer (10), depending on the material from which it is made, and especially if it is made of SiC, SiN, or SiON, for example.

Step 8

The via (14) may then be cleaned using various methods. Thus, it may be cleaned chemically, employing a non-corrosive semi-aqueous mixture. It may also be cleaned by a dry method, using an argon plasma with a power of around 300 kilowatts, by subjecting the region (14) to radiofrequency waves for a time of about one minute, at room temperature.

Step 9

Figure 7:
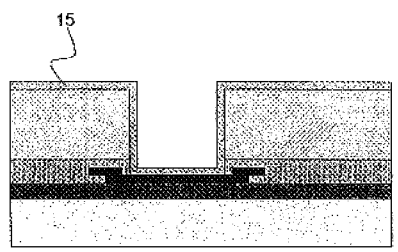

As illustrated in FIG. 7, the process continues with the deposition of a copper-diffusion barrier layer (15). This layer (15) is preferably made of a titanium-tungsten alloy or else is a superposition of titanium and titanium nitride, or else of tantalum and tantalum nitride. This layer (15) may also be made of tungsten nitride, or else by a single layer of tungsten, molybdenum, osmium or ruthenium. This layer (15), having thickness of between 100 and 400 Å, may be deposited by various techniques, and especially by sputtering, a process also known as IMP-PVD (Ionized Metal Plasma-Physical Vapor Deposition), or by CVD (Chemical Vapor Deposition) or ALD (Atomic Layer Deposition) techniques.

Step 10

Figure 8:
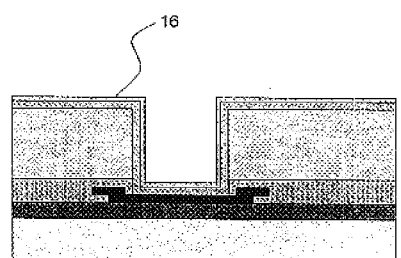

As illustrated in FIG. 8, the process continues with the deposition of a copper primer layer (16). This primer layer (16) may be deposited by various techniques, and especially by sputtering, a process also known as IMP-PVD (Ionized Metal Plasma-Physical Vapor Deposition) or by CVD (Chemical Vapor Deposition) or ALD (Atomic Layer Deposition) techniques. The layer thus obtained has a thickness typically of between 500 and 2000 Å.

Step 11

Figure 9:
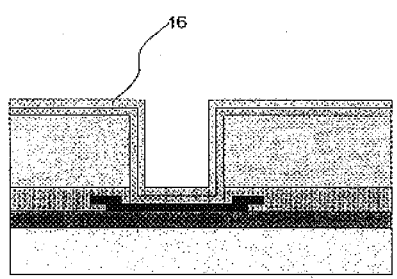

The process continues, as illustrated in FIG. 9, with a step of enriching the primer layer (16) electrolytically. A solution of copper salts such as $CuSO_4·5H_2O$, may be used. A reducing agent, such as dimethylamineborane may also be provided, as substitution of the electrolytic current.

This enrichment step makes it possible to fill the spaces between the copper islands that were deposited beforehand in order to form the primer layer. The surface of the primer layer (16) is thus smoothed, thereby favoring the subsequent electrodeposition step. This step allows the thickness of the primer layer inside the via, and more particularly on the inner faces and at the bottom of the via, to be increased.

Step 12

Figure 10:
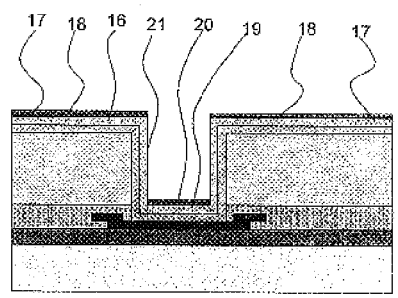

Thereafter, as illustrated in FIG. 10, a layer (18) of negative photoresist is deposited on those faces (17) of the primer layer (16) which are parallel to the substrate. This deposition (20) has also taken place at the bottom (19) of the via, but not on the vertical walls (21) of said via. This layer (18, 20) of negative photoresist has a thickness of around 5000 Å.

Step 13

Figure 11:
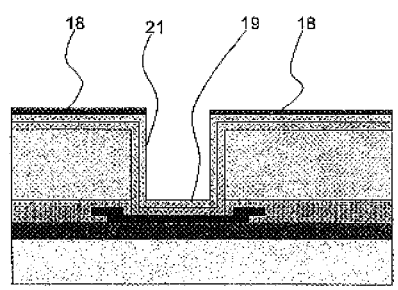

The process continues, as illustrated in FIG. 11, with the removal of the layer (20) of negative photoresist placed at the bottom (17) of the via (14). The remainder (18) of the negative photoresist is not removed following the photoexposure process, which cures the exposed resist.

Step 14

The process continues with a cleaning step by applying a solution that does not corrode copper, so as to obtain an optimum surface finish as regards the bottom (19) of the via and its sidewalls (21). The solution used is an aqueous solution which may contain molecules of a corrosion inhibitor, such as benzotriazole.

Step 15

Figure 12:
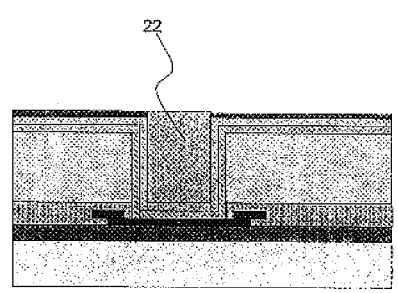

As illustrated in FIG. 12, the process continues with copper electrodepositions so as to fill (22) the via (14) using a technique known as "electroplating". This technique is based on the use of an electrolyte solution the formulation of which is judiciously defined in order to obtain optimum copper quality, namely a resistivity before grain growth during annealing of between 1.9 $\mu\Omega$.cm and 2.3 $\mu\Omega$.cm, and preferably between 2 $\mu\Omega$.cm and 2.15 $\mu\Omega$.cm. Moreover, the definition of the deposited layer depends directly on the geometry of the electrochemical cell, on the distance between the cathode and the anode, on the shape and characteristics of each electrode, and on the region and the surface on which it will be deposited. The solutions used may, for example, be those sold under the name "Cu VIAFORM" by Enthone or "Cu GLEAM ELECTRODEPOSIT 6000" by Shipley.

Step 16

Thereafter, a decontamination step may be carried out, making it possible to remove any trace of copper which would be liable to migrate into the substrate or into any other part in which copper ions could deposit themselves. This decontamination step makes it possible in particular to clean the rear of the substrate and the peripheral regions of the substrate. The expression "peripheral regions" includes the lateral faces of the substrate, perpendicular to the principal plane of the substrate, and the edges of the substrate on which excess deposits of copper associated with the copper deposition process, depending on the technique used, may have accumulated.

This decontamination step is carried out by a wet chemical technique by means of a tool allowing the substrate to be treated face by face, using a solution containing a mixture of hydrogen peroxide and sulfuric acid.

Step 17

Figure 13:
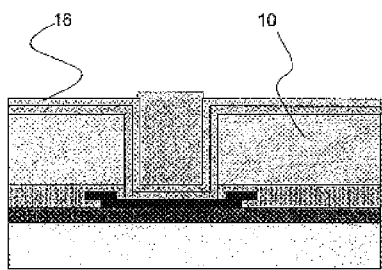

The process then continues as illustrated in FIG. 13 with the removal, by etching, of the negative photoresist mask which protected the copper primer layer on top of the BCB regions (10).

Step 18

The process continues with a cleaning step by applying a solution that does not corrode copper, so as to remove any trace of resist on the primer layer (10) for the purpose of making it easier to deposit the subsequent layers.

Step 19

The process continues with what is called an "annealing" step, allowing the crystalline structure of the copper (22) deposited in the via (14) to be reorganized by increasing the size of the elementary crystalline grains. This step uses a technique known as RTP (Rapid Thermal Processing) during which the component is subjected to a temperature of around 150 to 400° C., preferably 300° C., for a time of 10 seconds to 30 minutes and preferably for 5 minutes. The component is maintained in an atmosphere of an inert gas or in a vacuum, preventing any oxidation and diffusion of oxygen into the crystalline medium of the copper. The parameters are judiciously defined in order to obtain the optimum copper quality, namely a resistivity after grain growth of between 1.7 $\mu\Omega$.cm and 2 $\mu\Omega$.cm, but preferably between 1.72 $\mu\Omega$.cm and 1.82 $\mu\Omega$.cm.

Step 20

The process then continues with hexamethyldisilazane (HMDS) or divinyltetramethyldisilazane (DVTMDS) being spread by a centrifugal force. This step makes it possible to optimize the surface finish of the vertical sidewalls of the resist which will be subsequently deposited, and into which resist HMDS or DVTMDS will be able to diffuse during the annealing steps, since these additives lower the surface tension of this resist. Such a treatment promotes better adhesion of copper to the vertical sidewalls of the resist deposited subsequently, which form the walls of the via (14).

Step 21

Figure 14:
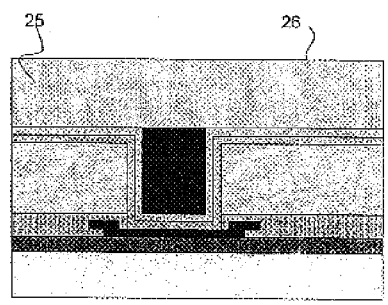

The process continues with the deposition of a top layer (25) of resist, as illustrated in FIG. 14. This resist (25) is of the positive photoresist type, for allowing the subsequent lithographic operations. This resist (25) is resistant to the acid chemistry of the electrodeposition.

The top layer (25) of resist thus deposited has a thickness of between 10 and 50 microns, preferably between 20 and 40 microns, depending on the height of the turns of the inductive component.

Step 22

Figure 15:
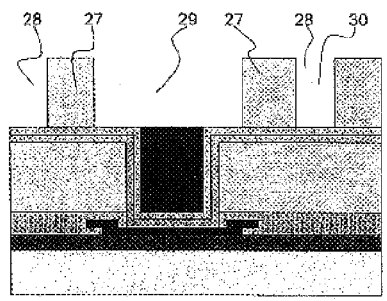

The process continues, as illustrated in FIG. 15, with the etching of this top layer (25) of resist in order to define, between the remaining regions (27), channels (28, 29) which will subsequently receive the copper that will form the turns of the inductive component. This etching operation is carried out by a standard lithography process.

Step 23

Figure 16:
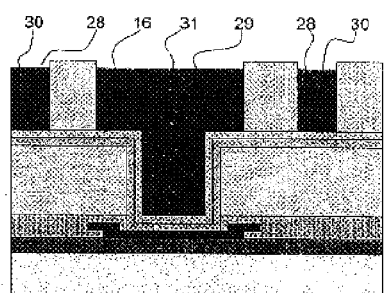
Figure 17:
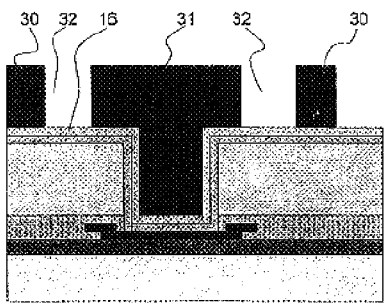

The process continues, as illustrated in FIG. 16, with an electrodeposition of copper on top of the primer layer (16). It will be noted that the thickness deposited in the peripheral channels (28) is the same as that in the channel (29) lying vertically above the via (4) so that the growth is substantially similar. In this case, the copper electrodeposition may be specifically carried out by means of an electrochemical deposition tool using a consumable copper anode and a chemical solution chosen from the various producers, such as the solution "Cu GLEAM ELECTRODEPOSIT 6000" sold by Shipley. The copper deposited typically fills between 70% and 90% of the channels (29) so as to give copper thicknesses for the turns of greater than 10 microns.

Step 24

The process continues with a decontamination step identical to that described in step 16.

Step 25

The process continues with the removal of the top resist regions (27) which defined the various channels (28, 29). Removal of this resist (27) clears the space (32) between the turns (30–31) so as to limit the inter-turn capacitance. This removal also makes the metal layers (16, 15) lying between the turns (30–31) accessible, so that they can be removed subsequently.

Step 26

The process continues, as already mentioned in step 18, with a cleaning step by applying a solution that does not corrode copper so as to remove all the residues left by the lithography step, the chemical process of which may use a compound consisting of amines and of molecules that do not corrode copper, chosen from the manufacturers of such products, such as the product ACT-970 from Ashland.

Step 27

Figure 18:
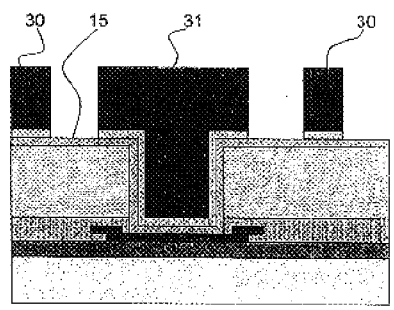

The process continues, as illustrated in FIG. 18, with wet anisotropic etching of the copper primer layer (16), for example by means of a sulfuric acid solution or a nitric acid solution that includes benzotriazole.

Step 28

Figure 19:
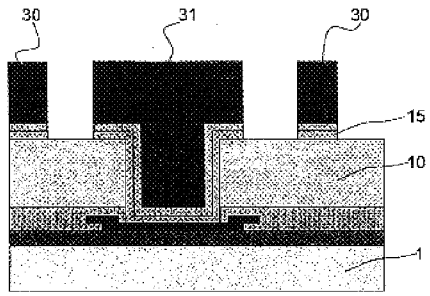

The process continues, as illustrated in FIG. 19, with the etching of the copper-diffusion barrier layer (15) which depends on the choice of material for the copper diffusion barrier. As an example, when the diffusion barrier layer is a superposition of two layers—a titanium layer and a titanium nitride layer—this diffusion barrier may be etched by an aqueous solution composed of ethylenediaminetetraacetic acid (EDTA) and of hydrogen peroxide in a ratio of 2 to 1, at a temperature of between 45° C. and 90° C., and preferably about 65° C. However, this example is not limiting and other chemical solutions according to the prior art may be used.

This means that the various turns (30) and the central part (31) of the inductive microcomponent are therefore electrically independent.

Step 29

The process continues with an annealing step similar to that described in step 19.

Step 30

The process continues with a cleaning step using a solution that does not corrode copper, such as one similar to that described in steps 18 and 26.

It is apparent from the foregoing that the process according to the invention makes it possible to obtain inductive microcomponents which have a very high quality factor, because of a controlled distance between the substrate and the principal plane of the inductive microcomponent. Typically, the quality factors obtained are greater than 40 at frequencies of around 2 gigahertz.

Splitting the copper electrodeposition into two separate steps makes it possible to optimize the regularity of the shape of the various turns without increasing the manufacturing costs, and therefore ensures good reproducibility of the process resulting in the production of a microcomponent having electrical properties very similar to those defined at the design stage and therefore the expected electrical performance.

Moreover, the advantage of this present invention is that it controls the interfaces between the various layers of materials deposited and formed, with the consequence that the performance of the device is significantly improved and sources of defects are considerably reduced.

What is claimed is:

1. A process for fabricating an electronic component, incorporating an inductive microcomponent having turns placed on top of a substrate and connected to the substrate via at least one metal pad, which comprises the following steps, consisting successively in:

a) depositing a layer of material having a low relative permittivity on the substrate;

b) depositing a layer forming a hard mask;

c) forming an aperture in the hard mask vertically above the metal pad;

d) etching the layer of material having a low relative permittivity down to the metal pad, in order to form an interconnection hole or via;

e) depositing a layer forming a copper-diffusion barrier;

f) depositing a copper primer layer;

g) depositing a protective mask and removing the protective mask from the bottom of the via;

h) depositing copper, electrolytically, in the via;

i) removing the rest of the protective mask;

j) depositing a top resist layer with a thickness similar to the thickness of the turns of the inductive microcomponent;

k) etching the resist layer in order to form channels defining the geometry of the turns of the inductive microcomponent;

l) depositing copper electrolytically in the channels thus etched to form copper turns;

m) removing the rest of the top resist layer;

n) etching the copper primer layer between the copper turns; and o) etching the copper-diffusion barrier layer between the turns of the inductive microcomponent.

2. The process as claimed in claim 1, wherein the substrate is a semiconductor substrate forming an integrated circuit.

3. The process as claimed in claim 1, wherein the substrate is an amorphous substrate of the glass or quartz type.

4. The process as claimed in claim 1, wherein the layer of material having a low relative permittivity deposited on the substrate is benzocyclobutene.

5. The process as claimed in claim 1, wherein the thickness of the layer of material having a low relative permittivity is between 10 and 40 microns, preferably about 20 microns.

6. The process as claimed in claim 1, wherein the material used for the layer forming the hard mask is chosen from the group consisting of: SiC, SiN, $Si_3N_4$, SiON, $SiO_2$, SiOC, $Y_2O_3$, Cr, taken individually or in combination.

7. The process as claimed in claim 1, wherein the hard mask is made of chromium, which also includes a step of removing the hard mask before the layer forming the copper diffusion barrier is deposited.

8. The process as claimed in claim 1, wherein the material used for the copper-diffusion barrier layer is chosen from the group consisting of: TiW, Ti, TiN, Ta, TaN, W, WN, Re, Cr, Os, Mo, Ru taken individually or in combination.

9. The process as claimed in claim 1, wherein the thickness of the copper-diffusion barrier layer is between 100 and 400 Å.

10. The process as claimed in claim 1, which includes a step of enriching the copper primer layer.

11. The process as claimed in claim 1, which includes an annealing step to increase the size of the copper crystals deposited during the electrodeposition steps.

12. The process as claimed in claim 1, which includes a step of decontaminating the copper liable to migrate into the substrate, especially at the lateral faces of the substrate.

13. The process as claimed in claim 12, wherein the decontamination step takes place after at least one of the copper electrodeposition steps.

14. The process as claimed in claim 1, wherein the protective mask deposited during the step following deposition of the copper primer layer is formed from a negative photoresist.

15. The process as claimed in claim 1, wherein, before the step of depositing the top resist layer, a treatment with hexamethyldisilazane (HMDS) or divinyl-tetramethyldisilazane (DVTMDS) is carried out, this treatment to give said top resist good copper adhesion properties.

16. The process as claimed in claim 1, which includes at least one chemical cleaning step not corrosive to copper after the copper electrodepositions and/or after the steps of depositing the copper primer layer and/or of the copper-diffusion barrier layer.

17. The process as claimed in claim 1, wherein the copper deposition to form the turns is carried out in order to give a copper thickness of greater than 10 microns.

* * * * *